United States Patent
Uejima

(10) Patent No.: US 8,334,731 B2
(45) Date of Patent: Dec. 18, 2012

(54) HIGH-FREQUENCY MODULE

(75) Inventor: Takanori Uejima, Moriyama (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 308 days.

(21) Appl. No.: 12/786,656

(22) Filed: May 25, 2010

(65) Prior Publication Data

US 2010/0301964 A1    Dec. 2, 2010

(30) Foreign Application Priority Data

May 26, 2009   (JP) ................. 2009-126667

(51) Int. Cl.
*H01P 1/10*    (2006.01)
*H03H 7/46*    (2006.01)

(52) U.S. Cl. ....................................... 333/101; 333/132

(58) Field of Classification Search .............. 333/101, 333/103, 104, 132; 455/78, 82, 83
See application file for complete search history.

(56) References Cited

U.S. PATENT DOCUMENTS

| | | | | |
|---|---|---|---|---|
| 4,037,177 A | * | 7/1977 | Tyrey | 333/32 |
| 5,054,114 A | * | 10/1991 | Erickson | 455/78 |
| 5,170,493 A | * | 12/1992 | Roth | 455/82 |
| 6,731,184 B1 | * | 5/2004 | Muto et al. | 333/103 |
| 7,023,296 B2 | * | 4/2006 | Uriu et al. | 333/132 |
| 7,057,472 B2 | * | 6/2006 | Fukamachi et al. | 333/101 |
| 7,183,875 B2 | * | 2/2007 | Muto et al. | 333/103 |
| 7,561,005 B2 | * | 7/2009 | Harada et al. | 333/133 |
| 2005/0221768 A1 | | 10/2005 | Kemmochi et al. | |
| 2007/0270105 A1 | | 11/2007 | Uejima et al. | |

FOREIGN PATENT DOCUMENTS

| | | | |
|---|---|---|---|
| CN | 101027847 A | | 8/2007 |
| CN | 101128985 A | | 2/2008 |
| CN | 101375515 A | | 2/2009 |
| CN | 101877599 A | | 11/2010 |
| EP | 1 981 173 A1 | | 10/2008 |
| JP | 2001-44883 A | | 2/2001 |
| JP | 2001-292073 A | | 10/2001 |
| JP | 2002-300080 A | | 10/2002 |
| JP | 2005-136744 A | | 5/2005 |
| JP | 2009-38807 A | | 2/2009 |
| WO | 00/55983 A1 | | 9/2000 |

OTHER PUBLICATIONS

Official Communication issued in corresponding Japanese Patent Application No. 2009-126667, mailed on Jun. 21, 2011.

* cited by examiner

*Primary Examiner* — Dean O Takaoka

(74) *Attorney, Agent, or Firm* — Keating & Bennett, LLP

(57) ABSTRACT

A high-frequency module includes at least first and second signal circuits that are each connected between a common antenna port and at least first and second signal ports. The first signal circuit includes a first inductor connected in series between the antenna port and the first signal port, a first capacitor connected in series between the first inductor and the first signal port, and a second inductor connected in shunt between the first capacitor and the first signal port. Series resonance is produced between the first inductor, the first capacitor, and the second inductor at a frequency within the frequency band of a target signal of the second signal circuit.

3 Claims, 7 Drawing Sheets

HIGH-FREQUENCY MODULE

BACKGROUND OF THE INVENTION

1. Field of the Invention

The present invention relates to a high-frequency module used in, for example, a front end portion of a mobile phone.

2. Description of the Related Art

High-frequency modules that support multiple frequency bands use a single antenna for multiple communication systems using different frequency bands (for example, see Japanese Unexamined Patent Application Publication No. 2001-292073).

The high-frequency module disclosed in Japanese Unexamined Patent Application Publication No. 2001-292073 includes a diplexer connected to the antenna. A high-frequency signal circuit is isolated from a low-frequency signal circuit by the diplexer. The high-frequency signal circuit and the low-frequency signal circuit each include a switch circuit. The switch circuit includes a diode connected in series to a signal path for transmission signals and a diode connected in shunt to a signal path for reception signals. Switching off the diode provided in the switch circuit breaks the connection between the antenna and the signal path for transmission signals and makes the connection between the antenna and the signal path for reception signals. Switching on the diode makes the connection between the antenna and the signal path for transmission signals and breaks the connection between the antenna and the signal path for reception signals.

In general, when either of the high-frequency signal circuit and the low-frequency signal circuit is used in a typical high-frequency module, the transmission state or the reception state of the circuit that is used is switched by switching on or off the diode. The isolation between the low-frequency signal circuit and the high-frequency signal circuit is ensured by the diplexer provided therebetween. All of the diodes are switched off in the circuit that is not used.

If sufficient isolation is not ensured by the diplexer, there is a problem in that a transmission signal leaks from the circuit that is being used to the circuit that is not being used. Specifically, harmonic distortion can be caused in the diode in the circuit that is not being used, particularly, in the diode provided in the signal path for transmission signals to degrade the harmonic characteristics of the high-frequency module.

SUMMARY OF THE INVENTION

To overcome the problems described above, preferred embodiments of the present invention provide a high-frequency module capable of improving the isolation between the high-frequency signal circuit and the low-frequency signal circuit as compared to the related art to suppress the occurrence of harmonic distortion and the degradation of harmonic characteristics.

According to a preferred embodiment of the present invention, a high-frequency module includes at least first and second signal circuits, a common antenna port, and at least first and second signal ports. The at least first and second signal circuits are each connected between the common antenna port and the at least first and second signal ports. The first signal circuit includes a first inductor, a first capacitor, and a second inductor. The first inductor is connected in series between the antenna port and the first signal port. The first capacitor is connected in series between the first inductor and the first signal port. The second inductor is connected in shunt between the first capacitor and the first signal port. Series resonance is produced between the first inductor, the first capacitor, and the second inductor at a frequency within the frequency band of a target signal of the second signal circuit.

With the above-described configuration, it is possible to prevent leakage of a signal from the second signal circuit into the first signal circuit so as to suppress the occurrence of the harmonic distortion and the degradation of the harmonic characteristics in the first signal circuit, which are caused by the leakage of the signal from the second signal circuit.

The first signal circuit preferably further includes a first switch element, a second switch element, and a second capacitor. A first end of the first switch element is connected between the first inductor and the first capacitor. The second capacitor is connected in series between a second end of the first switch element and the ground. The second switch element is connected in series between the antenna port and the second signal port. The first inductor is a line having an electrical length that is equal or substantially equal to about one fourth of the wavelength of a signal propagated between the antenna port and the second signal port. The series resonance is produced between the second capacitor and the inductance occurring in the first switch element during the operation of the first switch element at a frequency within the frequency band of the signal propagated between the antenna port and the second signal port.

With the above-described configuration, when the first and second switch elements are turned on, leakage of a signal from the second signal port into the first signal port in the first signal circuit can be effectively suppressed. When the first and second switch elements are turned off, the series resonance can be produced between the first inductor, the first capacitor, and the second inductor to suppress leakage of a signal from the second signal circuit into the first signal circuit. Accordingly, it is possible to assign different functions to the first inductor between when the first and second switch elements are turned on and when the first and second switch elements are turned off, thus enabling a decrease in the number of elements and a reduction in size of the high-frequency module.

The first signal circuit may preferably further include a filter element. The filter element is connected in series between the first capacitor and the first signal port. In this case, it is preferable that one end of the second inductor be connected between the first capacitor and the filter element, and that the first capacitor and the second inductor function as a matching circuit for the filter element.

With the above-described configuration, it is possible to cause the first capacitor and the second inductor to function as the matching circuit for the filter element, thus enabling a decrease in the number of elements and a reduction in size of the high-frequency module.

The frequency of a signal propagated through the first signal circuit is preferably higher than that of a signal propagated through the second signal circuit.

With the above configuration, it is possible to achieve a reduction in size of the second inductor and the first capacitor in the first signal circuit defining a high-frequency signal circuit.

According to preferred embodiments of the present invention, the series resonance between the first inductor, the first capacitor, and the second inductor in the first signal circuit can be used to suppress leakage of a signal from the second signal circuit into the first signal circuit. Accordingly, the isolation between the first signal circuit and the second signal circuit is improved so as to suppress an occurrence of the harmonic distortion and degradation of the harmonic characteristics.

The above and other features, elements, steps, characteristics, and advantages of the present invention will become more apparent from the following detailed description of preferred embodiments of the present invention with reference to the attached drawings.

DETAILED DESCRIPTION OF THE PREFERRED EMBODIMENTS

An example of the configuration of a high-frequency module according to a first preferred embodiment of the present invention will be described below.

The high-frequency module according to the first preferred embodiment is preferably used, for example, in a front end portion of a mobile phone and preferably supports four communication systems for a global system for mobile communication (GSM) 850 MHz band, a GSM 900 MHz band, a GSM 1800 MHz band, and a GSM 1900 MHz band.

Figure 1:
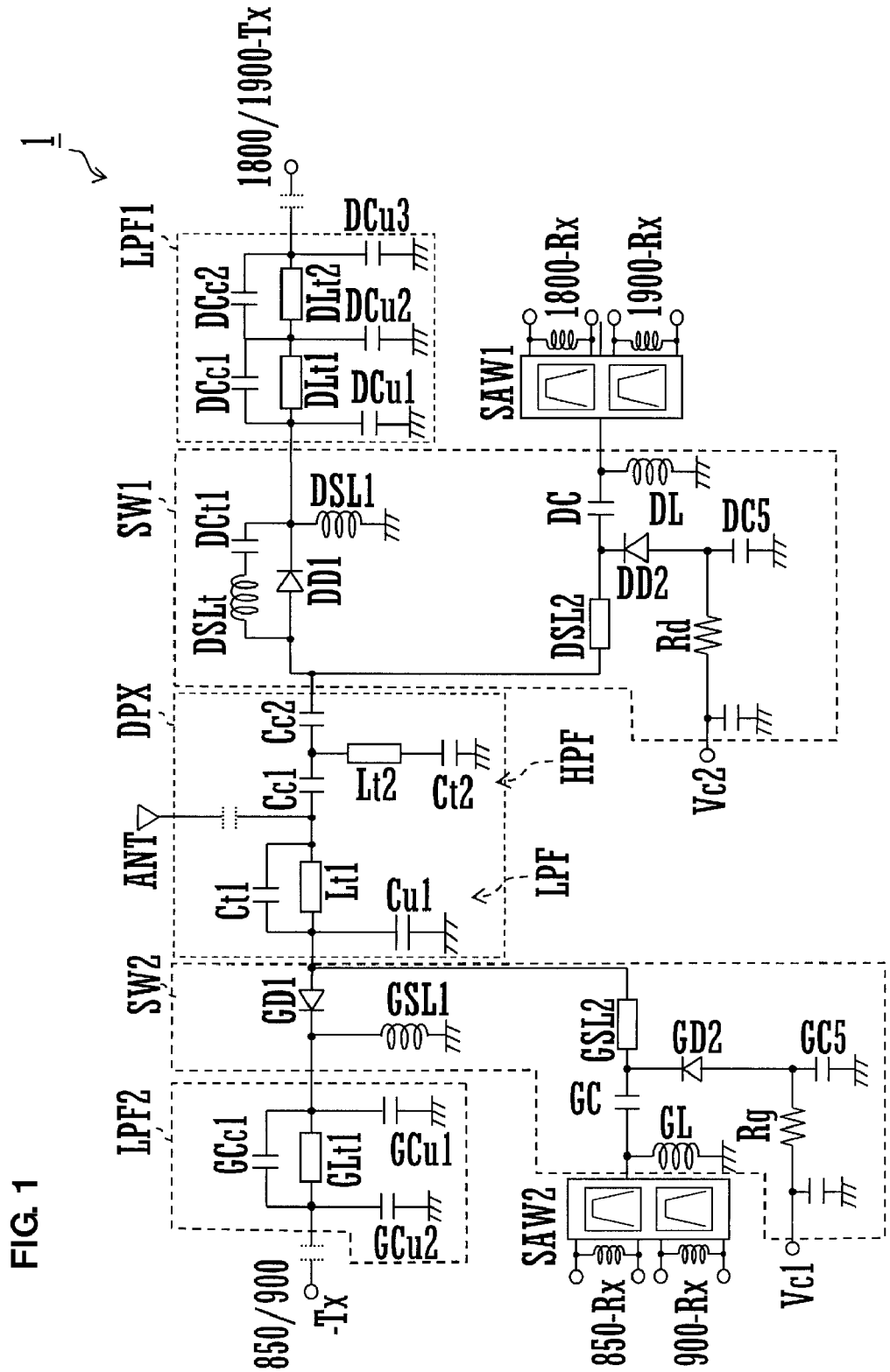
FIG. 1 is a schematic circuit diagram of a high-frequency module according to a first preferred embodiment of the present invention.

FIG. 1 is a schematic circuit diagram of a high-frequency module 1 according to the first preferred embodiment.

Referring to FIG. 1, the high-frequency module 1 includes a diplexer DPX, switch circuits SW1 and SW2, low pass filters LPF1 and LPF2, and surface acoustic wave filters SAW1 and SAW2. The high-frequency module 1 includes an antenna port ANT, signal ports 1800/1900-Tx, 1800-Rx, 1900-Rx, 850/900-Tx, 850-Rx, and 900-Rx, and control ports Vc1 and Vc2 as external connection ports.

The diplexer DPX includes a low pass filter LPF and a high pass filter HPF. The connection point between the low pass filter LPF and the high pass filter HPF is connected to the antenna port ANT via a matching capacitor. The low pass filter LPF is connected between the antenna port ANT and the switch circuit SW2. The high pass filter HPF is connected between the antenna port ANT and the switch circuit SW1. GSM850 and GSM900 signals pass through the low pass filter LPF and GSM1800 and GSM1900 signals are attenuated through the low pass filter LPF. The GSM1800 and GSM1900 signals pass through the high pass filter HPF and the GSM850 and GSM900 signals are attenuated through the high pass filter HPF.

The low pass filter LPF includes a capacitor Ct1, an inductor Lt1, and a capacitor Cu1. The capacitor Ct1 is connected in parallel to the inductor Lt1. A first end of the inductor Lt1 and a first end of the capacitor Ct1 are connected to the antenna port ANT via the matching capacitor. A second end of the inductor Lt1 and a second end of the capacitor Ct1 are connected to the switch circuit SW2 and are grounded via the capacitor Cu1.

The high pass filter HPF includes capacitors Cc1 and Cc2, an inductor Lt2, and a capacitor Ct2. A first end of the capacitor Cc1 is connected to the antenna port ANT via the matching capacitor. A first end of the capacitor Cc2 is connected to a second end of the capacitor Cc1 and a second end of the capacitor Cc2 is connected to the switch circuit SW1. The second end of the capacitor Cc1 and the first end of the capacitor Cc2 are grounded via the inductor Lt2 and the capacitor Ct2. A first end of the inductor Lt2 is connected to the connection point between the capacitor Cc1 and the capacitor Cc2. A first end of the capacitor Ct2 is connected to a second end of the inductor Lt2 and a second end of the capacitor Ct2 is grounded.

The switch circuit SW1 is provided in a signal path through which the GSM1800 and GSM1900 signals are propagated. The switch circuit SW1 is connected to the high pass filter HPF, the low pass filter LPF1, and the surface acoustic wave filter SAW1 and is used to switch between GSM1800 and GSM1900 transmission signals and GSM1800 and GSM1900 reception signals. The signal path in the switch circuit SW1 between the high pass filter HPF and the low pass filter LPF1 includes a diode DD1, an inductor DSLt, a capacitor DCt1, and an inductor DSL1. The signal path in the switch circuit SW1 between the high pass filter HPF and the surface acoustic wave filter SAW1 includes an inductor DSL2, a capacitor DC, an inductor DL, a diode DD2, a capacitor DC5, and a resistor Rd.

An anode of the diode DD1 is connected to the high pass filter HPF and a cathode thereof is connected to the low pass filter LPF1. A first end of the inductor DSLt is connected to the anode of the diode DD1. A first end of the capacitor DCt1 is connected to a second end of the inductor DSLt and a second end of the capacitor DCt1 is connected to the cathode of the diode DD1. The cathode of the diode DD1 is grounded via the inductor DSL1.

A first end of the inductor DSL2 is connected to the connection point between the high pass filter HPF and the diode DD1. The inductor DSL2 preferably has a line length that is equal to about one fourth of the wavelength of the GSM1800 and GSM1900 transmission signals. A first end of the capacitor DC is connected a second end of the inductor DSL2, and a second end of the capacitor DC is connected to the surface acoustic wave filter SAW1 and is grounded via the inductor DL. The capacitor DC and the inductor DL are adjusted so as to perform impedance matching between the inductor DSL2 and the surface acoustic wave filter SAW1. A cathode of the diode DD2 is connected to the connection point between the inductor DSL2 and the capacitor DC. An anode of the diode DD2 is connected to the control port Vc2 via the resistor Rd and is grounded via the capacitor DC5. In the switch circuit SW1, the states of the diodes DD1 and DD2 are switched on the basis of a voltage externally supplied through the control port Vc2.

When the switch circuit SW1 is in a transmission state, a voltage higher than a switching voltage is applied to the anode of the diode DD2 and the voltage higher than the switching voltage is also applied to the anode of the diode DD1.

As a result, the diode DD1 is turned on to propagate a transmission signal from the signal port 1800/1900-Tx to the antenna port ANT. Since the diode DD2 is also turned on at this time, the second end of the inductor DSL2 is grounded via the capacitor DC5 and series resonance occurs between the inductance component of the diode DD2 and the capacitor DC5. The line length of the inductor DSL2 is set to an electrical length that is equal to about one fourth of the wavelength of the GSM1800 and GSM1900 transmission signals, and the diode DD2 side of the inductor DSL2 is grounded via the series resonance. Accordingly, the inductor DSL2 side of the connection point between the inductor DSL2 and the diode DD1, viewed from the diplexer DPX, is in an open state to suppress the propagation of the transmission signal to the signal port 1800-Rx or the signal port 1900-Rx. The switch circuit SW1 may be configured so that the series resonance occurs between the inductance component during the operation of the diode DD2, the capacitor DC5, and the inductor DSL2.

When the switch circuit SW1 is in a reception state, a voltage lower than the switching voltage is applied to the anode of the diode DD2 and the voltage lower than the switching voltage is also applied to the anode of the diode DD1.

As a result, the diode DD1 is turned off to block the propagation of the reception signal to the signal port 1800/1900-Tx. Since the diode DD2 is also turned off at this time, the connection between the diode DD2 and the inductor DSL2 is broken. Accordingly, the reception signal is propagated from the antenna port ANT to the signal port 1800-Rx or the signal port 1900-Rx.

The low pass filter LPF1 filters out second harmonic wave and third harmonic wave components of the transmission signal. The low pass filter LPF1 is connected between the switch circuit SW1 and the signal port 1800/1900-Tx and includes inductors DLt1 and DLt2, capacitors DCc1 and DCc2, and capacitors DCu1, DCu2, and Dcu3. The inductor DLt1 is connected in parallel to the capacitor DCc1. A first end of the inductor DLt1 and a first end of the capacitor DCc1 are connected to the switch circuit SW1 and are grounded via the capacitor DCu1. The inductor DLt2 is connected in parallel to the capacitor DCc2. A first end of the inductor DLt2 and a first end of the capacitor DCc2 are connected to a second end of the inductor DLt1 and a second end of the capacitor DCc1, respectively, and are grounded via the capacitor DCu2. A second end of the inductor DLt2 and a second end of the capacitor DCc2 are connected to the signal port 1800/1900-Tx via a direct current blocking capacitor and are grounded via the capacitor DCu3.

The surface acoustic wave filter SAW1 isolates the GSM1800 reception signal from the GSM1900 reception signal. The surface acoustic wave filter SAW1 is connected between the switch circuit SW1, the signal port 1800-Rx, and the signal port 1900-Rx.

In the circuit described above, during transmission and reception of signals in a circuit of the GSM850 and GSM900 signals described below, a portion of the GSM850 or GSM900 signal (for example, having a transmission signal output level of about 35 dBm) can leak from the high pass filter HPF in the diplexer DPX into the switch circuit SW1.

Figure 2:
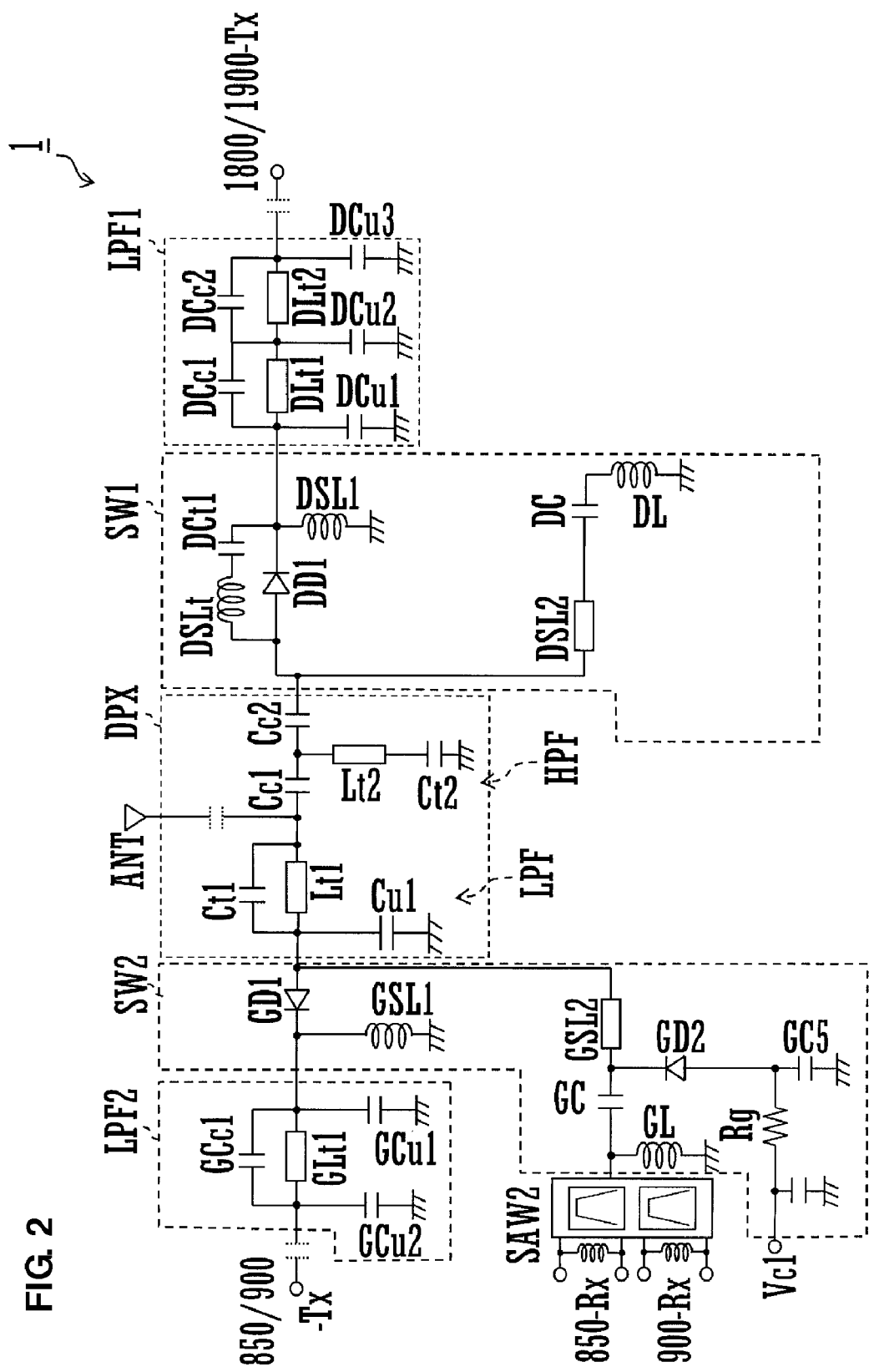
FIG. 2 is an equivalent circuit of the high-frequency module shown in FIG. 1.

According to the first preferred embodiment, when the GSM850 or GSM900 signal is used, the diode DD1 and the diode DD2 in the switch circuit SW1 are turned off. Since the diode DD2 has a sufficiently low capacitance when it is turned off, the diode DD2 has a high impedance and the reflection coefficient is increased in the diode DD2. As a result, the diode DD2 side of the connection point between the diode DD2 and the inductor DSL2 is opened as viewed from the diplexer DPX. In addition, since the surface acoustic wave filter SAW1 has a sufficiently high impedance in the frequency band of the GSM850 or GSM900 transmission signals, the reflection coefficient is increased in the surface acoustic wave filter SAW1. As a result, the surface acoustic wave filter SAW1 side of the connection point between the surface acoustic wave filter SAW1 and the inductor DL is also opened as viewed from the diplexer DPX. FIG. 2 is an equivalent circuit of the high-frequency module 1 when the GSM850 or GSM900 signal is used.

Consequently, the series resonance occurs between the inductor DSL2, the capacitor DC, and the inductor DL. When the resonant frequency of the series resonance is set to the frequency band of the GSM850 and GSM900 signals, and particularly, to the frequency band of the GSM850 and GSM900 transmission signals, the impedance of the connection point between the switch circuit SW1 and the diplexer DPX is short-circuited to reflect the leakage of the signal from the circuit of the GSM850 and GSM900 signals. Accordingly, an occurrence of the harmonic distortion caused by a leakage of the GSM850 or GSM900 signal into the diode DD1 or the diode DD2 can be suppressed to improve the harmonic characteristics of the high-frequency module 1.

The effect on the harmonic distortion that depends on the presence of the series resonance will now be described on the basis of an experimental example in which the capacitance of the capacitor DC is varied without varying the inductances of the inductor DSL2 and the inductor DL.

When the series resonance was produced with the capacitance of the capacitor DC set to about 3 pF, the second harmonic distortion of the GSM850 transmission signal was about −83.1 dBc, the third harmonic distortion of the GSM850 transmission signal was about −85.4 dBc, the second harmonic distortion of the GSM900 transmission signal was about −81.4 dBc, and the third harmonic distortion of the GSM900 transmission signal was about −86.2 dBc. In contrast, when the series resonance was not produced without the capacitor DC, the second harmonic distortion of the GSM850 transmission signal was about −64.6 dBc, the third harmonic distortion of the GSM850 transmission signal was about −82.8 dBc, the second harmonic distortion of the GSM900 transmission signal was about −60.9 dBc, and the third harmonic distortion of the GSM900 transmission signal was about −76.7 dBc.

As described above, the levels of the harmonic distortion when the series resonance was produced were lower than those when the series resonance was not produced in the above experiment.

In the above configuration, the circuit defined by the high pass filter HPF, the switch circuit SW1, the low pass filter LPF1, and the surface acoustic wave filter SAW1 corresponds to a first signal circuit when the GSM850 or GSM900 signal is used. In this case, the circuit defined by the low pass filter LPF, the switch circuit SW2, the low pass filter LPF2, and the surface acoustic wave filter SAW2 corresponds to a second signal circuit. The diode DD1 corresponds to a second switch element, the diode DD2 corresponds to a first switch element, the inductor DSL2 corresponds to a first inductor, the inductor DL corresponds to a second inductor, the capacitor DC corresponds to a first capacitor, and the capacitor DC5 corresponds to a second capacitor.

The switch circuit SW2 is provided in a signal path through which the GSM850 and GSM900 signals are propagated. The switch circuit SW2 is connected to the low pass filter LPF, the low pass filter LPF2, and the surface acoustic wave filter SAW2 and is used to switch between GSM850 and GSM900 transmission signals and GSM850 and GSM900 reception signals. The signal path in the switch circuit SW2 between the low pass filter LPF and the low pass filter LPF2 includes a diode GD1 and an inductor GSL1. The signal path in the switch circuit SW2 between the low pass filter LPF and the surface acoustic wave filter SAW2 includes an inductor GSL2, a capacitor GC, an inductor GL, a diode GD2, a capacitor GC5, and a resistor Rg.

An anode of the diode GD1 is connected to the low pass filter LPF and a cathode thereof is connected to the low pass filter LPF2. The cathode of the diode GD1 is grounded via the inductor GSL1.

A first end of the inductor GSL2 is connected to the connection point between the low pass filter LPF and the diode GD1. The inductor GSL2 is a line having an electrical length that is equal to about one fourth of the wavelength of the GSM850 and GSM900 transmission signals. A first end of the capacitor GC is connected to a second end of the inductor GSL2, and a second end of the capacitor GC is connected to the surface acoustic wave filter SAW2 and is grounded via the inductor GL. The capacitor GC and the inductor GL are adjusted so as to perform the impedance matching between the inductor GSL2 and the surface acoustic wave filter SAW2. A cathode of the diode GD2 is connected to the connection point between the inductor GSL2 and the capacitor GC. An anode of the diode GD2 is connected to the control port Vc1 via the resistor Rg and is grounded via the capacitor GC5. In the switch circuit SW2, the states of the diodes GD1 and GD2 are switched on the basis of a voltage externally supplied through the control port Vc1.

When the switch circuit SW2 is in the transmission state, a voltage higher than the switching voltage is applied to the anode of the diode GD2 and the voltage higher than the switching voltage is also applied to the anode of the diode GD1.

As a result, the diode GD1 is turned on to propagate a transmission signal from the signal port 850/900-Tx to the antenna port ANT. Since the diode GD2 is also turned on at this time, the second end of the inductor GSL2 is grounded via the capacitor GC5 and the series resonance occurs between the inductance component of the diode GD2 and the capacitor GC5. The line length of the inductor GSL2 is preferably set to an electrical length that is equal to about one fourth of the wavelength of the GSM850 and GSM900 transmission signals, and the diode GD2 side of the inductor GSL2 is grounded via the series resonance. Accordingly, the inductor GSL2 side of the connection point between the inductor GSL2 and the diode GD1, as viewed from the diplexer DPX, is in the open state to suppress the propagation of the transmission signal to the signal port 850-Rx or the signal port 900-Rx. The switch circuit SW2 may be configured so that the series resonance occurs between the inductance component during the operation of the diode GD2, the capacitor GC5, and the inductor GSL2.

When the switch circuit SW2 is in the reception state, a voltage lower than the switching voltage is applied to the anode of the diode GD2 and the voltage lower than the switching voltage is also applied to the anode of the diode GD1.

As a result, the diode GD1 is turned off to block the propagation of the transmission signal from the signal port 850/900-Tx to the antenna port ANT. Since the diode GD2 is also turned off at this time, the connection between the diode GD2 and the inductor GSL2 is broken. Accordingly, the reception signal is propagated from the antenna port ANT to the signal port 850-Rx or the signal port 900-Rx.

The low pass filter LPF2 filters out the second harmonic wave and third harmonic wave components of the transmission signal. The low pass filter LPF2 is connected between the switch circuit SW2 and the signal port 850/900-Tx and includes an inductor GLt1, a capacitor GCc1, and capacitors GCu1 and GCu2. The inductor GLt1 is connected in parallel to the capacitor GCc1. A first end of the inductor GLt1 and a first end of the capacitor GCc1 are connected to the switch circuit SW2 and are grounded via the capacitor GCu1. A second end of the inductor GLt1 and a second end of the capacitor GCc1 are connected to the signal port 850/900-Tx via a direct current blocking capacitor and are grounded via the capacitor GCu2.

The surface acoustic wave filter SAW2 isolates the GSM850 reception signal from the GSM900 reception signal. The surface acoustic wave filter SAW2 is connected between the switch circuit SW2, the signal port 850-Rx, and the signal port 900-Rx.

In the circuit described above, in transmission and reception of signals in the circuit of the GSM1800 and GSM1900 signals described above, a portion of the GSM1800 or GSM1900 signal (for example, having a transmission signal output level of about 35 dBm) can leak from the low pass filter LPF in the diplexer DPX into the switch circuit SW2.

According to the first preferred embodiment, when the GSM1800 or GSM1900 signal is used, the diode GD1 and the diode GD2 in the switch circuit SW2 are turned off. In this state, the series resonance occurs between the inductor GSL2, the capacitor GC, and the inductor GL. When the resonant frequency of the series resonance is set to the frequency band of the GSM1800 and GSM1900 signals, particularly, to the frequency band of the GSM1800 and GSM1900 transmission signals, the impedance of the connection point between the switch circuit SW2 and the diplexer DPX is short-circuited to reflect the leakage of the signal from the circuit of the GSM1800 and GSM1900 signals. Accordingly, an occurrence of the harmonic distortion caused by a leakage of the GSM1800 or GSM1900 signal into the diode GD1 or the diode GD2 can be suppressed to improve the harmonic characteristics of the high-frequency module 1.

In order to cause the series resonance to occur for the GSM1800 and GSM1900 high-frequency signals, it is necessary to make the inductance values of the inductor GSL2 and the inductor GL higher than those of the inductor DSL2 and the inductor DL. Accordingly, there are cases in which it is difficult to practically match the resonant frequency of the series resonance with the frequency band of the GSM1800 and GSM1900 signals. In such a case, the capacitor GC and the inductor GL may not necessarily be provided.

In the above configuration, the circuit defined by the low pass filter LPF, the switch circuit SW2, the low pass filter LPF2, and the surface acoustic wave filter SAW2 corresponds to the first signal circuit when the GSM1800 or GSM1900 signal is used. In this case, the circuit defined by the high pass filter HPF, the switch circuit SW1, the low pass filter LPF1, and the surface acoustic wave filter SAW1 corresponds to the second signal circuit. The diode GD1 corresponds to the second switch element, the diode GD2 corresponds to the first switch element, the inductor GSL2 corresponds to the first inductor, the inductor GL corresponds to the second inductor, the capacitor GC corresponds to the first capacitor, and the capacitor GC5 corresponds to the second capacitor.

The high-frequency module 1 having the above-described configuration can be realized as a layered substrate having the following configuration.

Figure 3A:
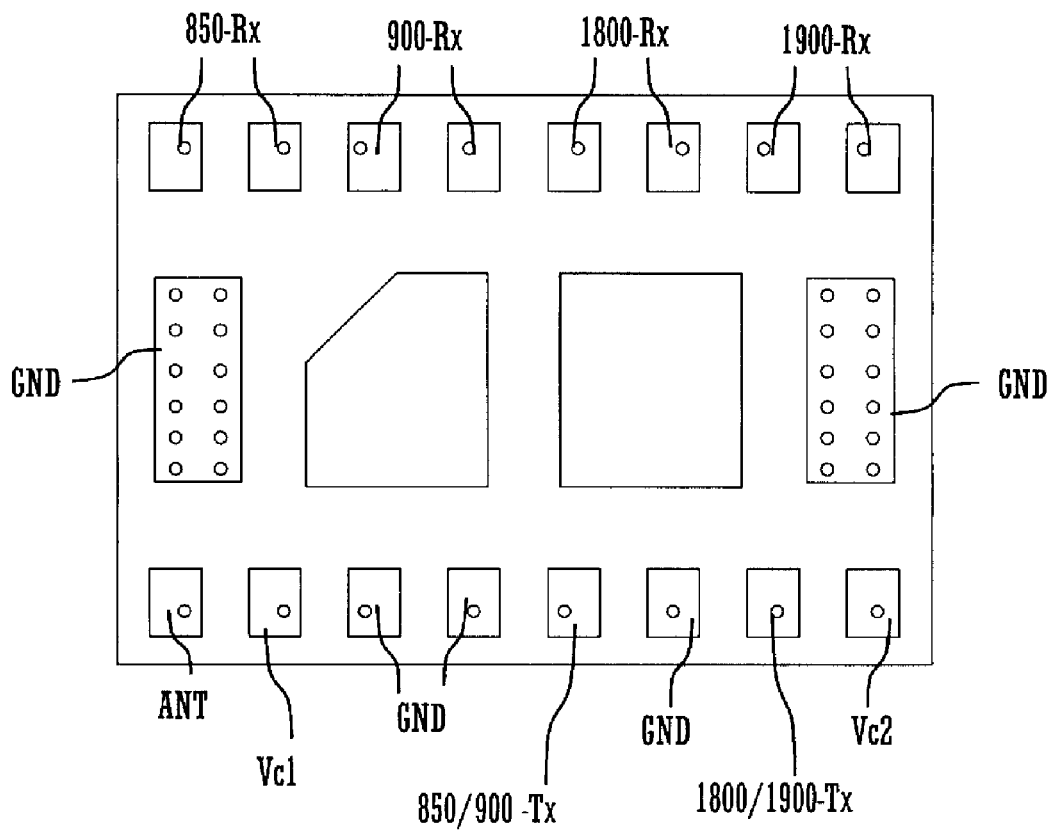
FIGS. 3A and 3B are plan views of the high-frequency module shown in FIG. 1.

FIG. 3A is a bottom view of the bottom layer of the high-frequency module 1.

The bottom surface of the high-frequency module 1 is used as a mounting surface and multiple mounting electrodes are provided on the mounting surface. The port name of each mounting electrode is shown in FIG. 3A.

Figure 3B:
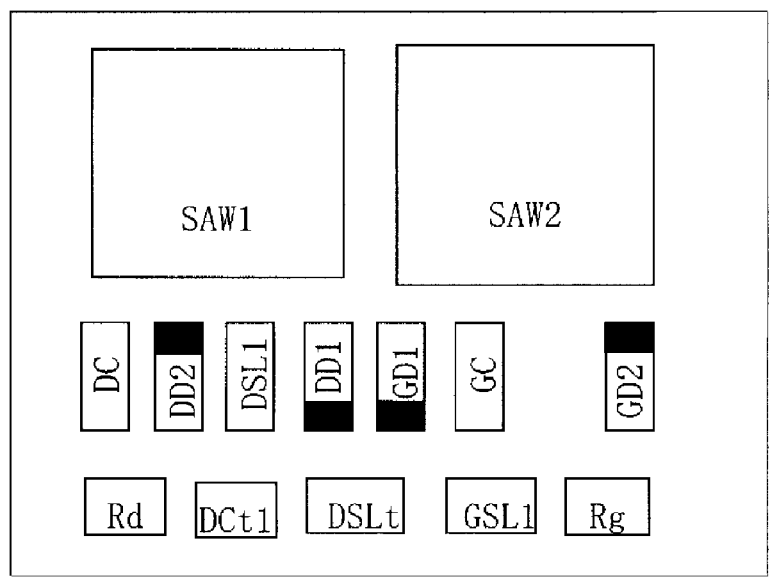
Figure 4A:
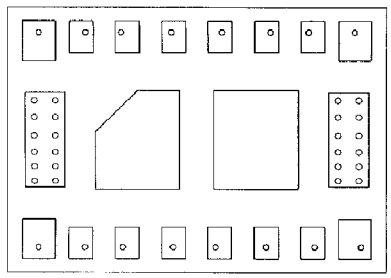
FIGS. 4A to 4H are layer views of the high-frequency module shown in FIG. 1.
Figure 4E:
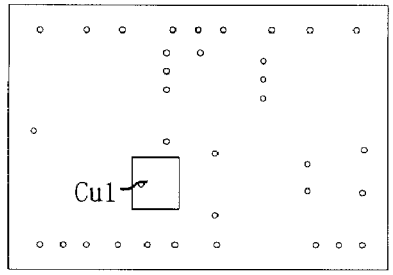
Figure 4B:
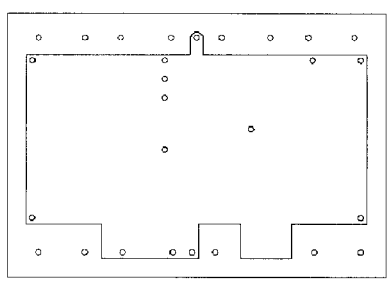
Figure 4F:
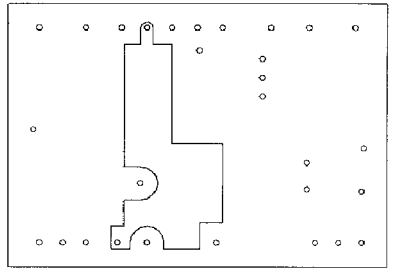
Figure 4C:
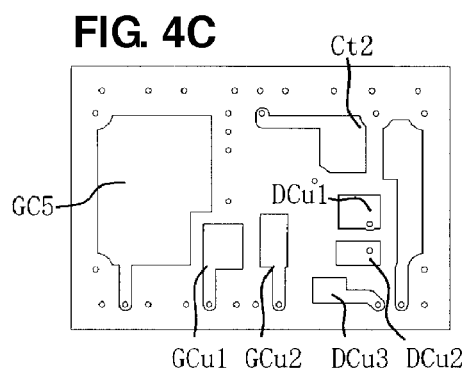
Figure 4G:
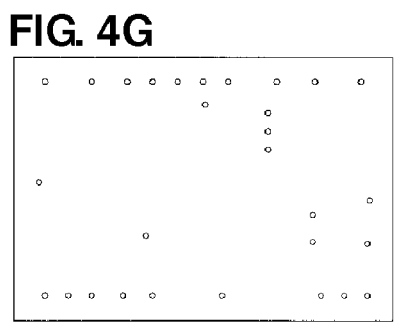
Figure 4D:
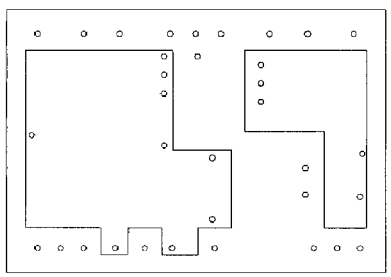
Figure 4H:
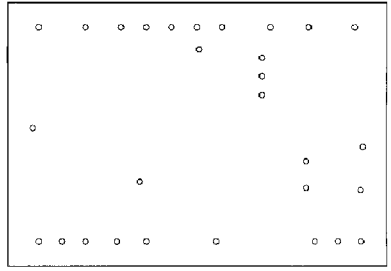
Figure 5I:
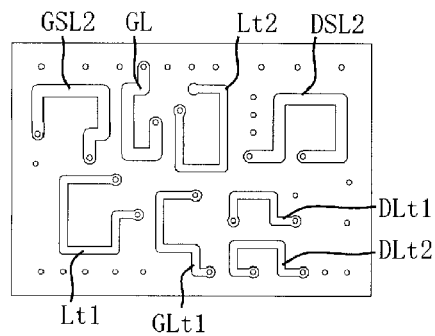
FIGS. 5I to 5P are layer views of the high-frequency module shown in FIG. 1.
Figure 5M:
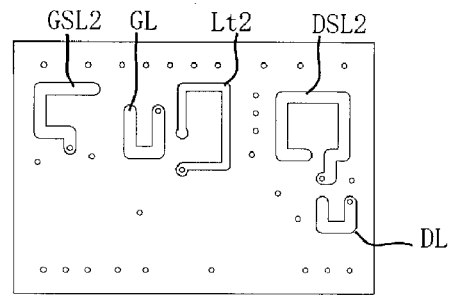
Figure 5J:
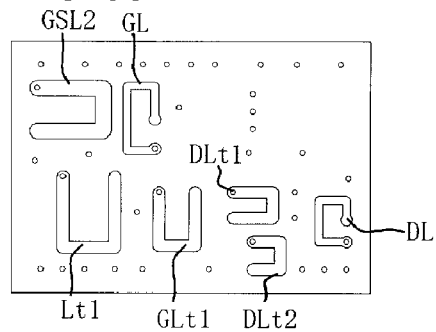
Figure 5N:
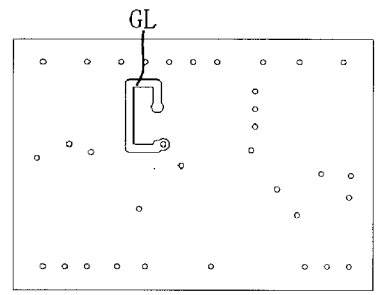
Figure 5K:
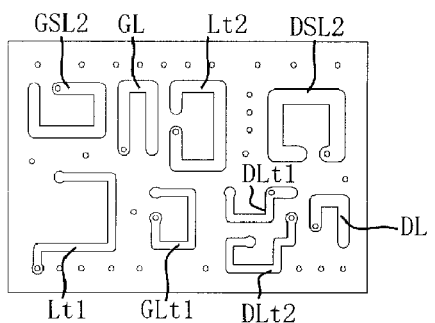
Figure 5O:
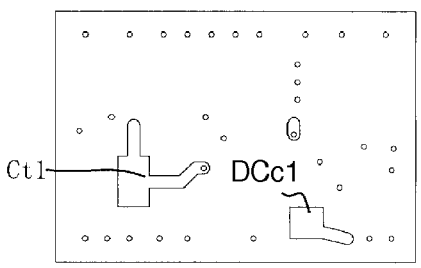
Figure 5L:
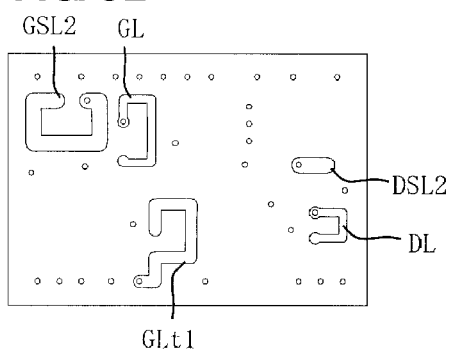
Figure 5P:
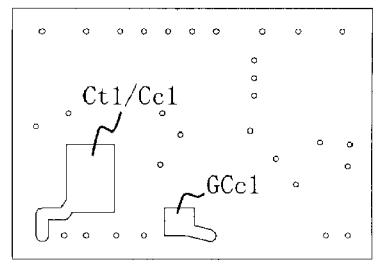
Figure 6Q:
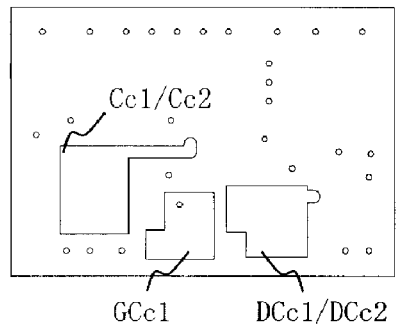
FIGS. 6Q to 6T are layer views of the high-frequency module shown in FIG. 1.
Figure 6R:
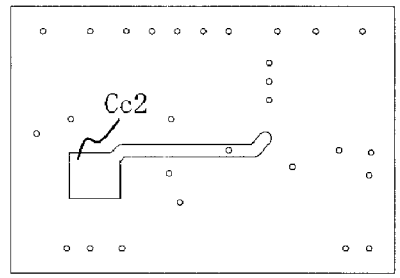
Figure 6S:
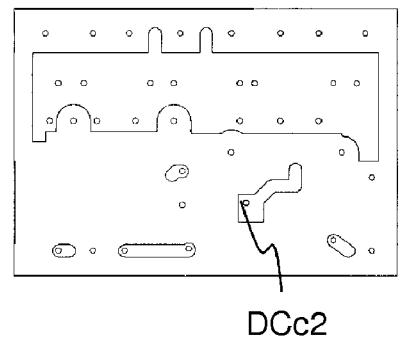
Figure 6T:
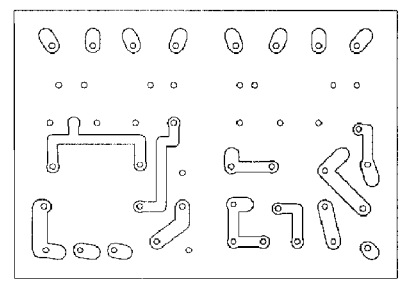

FIG. 3B is a top view of the top layer of the high-frequency module 1.

The top surface of the high-frequency module 1 is used as a surface on which elements are installed (hereinafter referred to as an element installed surface). Multiple surface electrodes are provided on the element installed surface and elements are installed on the surface electrodes. The name of each element is shown in FIG. 3B. According to the first preferred embodiment, the capacitors GC and DC are mounted as elements to facilitate the adjustment of the frequency of the series resonance.

FIGS. 4A to 6T are layer views of the high-frequency module 1. FIGS. 4A to 4H, FIGS. 5I to 5P, and FIGS. 6Q to 6T are plan views of substrates A to T, viewed from their bottom surfaces. The substrate A corresponds to the bottom layer and the substrate T corresponds to the top layer. Via electrodes in the substrate A to T are shown by circles in FIGS. 4A to 6T.

The substrate A is layered on the bottom layer of the multilayer substrate.

The substrate B is layered on the second layer from the bottom of the multilayer substrate. An inner-layer ground electrode is provided on the bottom surface of the substrate B.

The substrate C is layered on the third layer from the bottom of the multilayer substrate. Pattern electrodes defining the capacitors GC5, Ct2, DCu1, DCu2, DCu3, GCu1, and GCu2 are provided on the bottom surface of the substrate C.

The substrate D is layered on the fourth layer from the bottom of the multilayer substrate. Inner-layer ground electrodes are provided on the bottom surface of the substrate D.

The substrate E is layered on the fifth layer from the bottom of the multilayer substrate. A pattern electrode composing the capacitor Cu1 is provided on the bottom surface of the substrate E.

The substrate F is layered on the sixth layer from the bottom of the multilayer substrate. An inner-layer ground electrode is provided on the bottom surface of the substrate F.

The substrate G is layered on the seventh layer from the bottom of the multilayer substrate.

The substrate H is layered on the eighth layer from the bottom of the multilayer substrate.

The capacitors GC5, Ct2, DCu1, DCu2, DCu3, GCu1, GCu2, and Cu1 are arranged across the substrates B to F.

The substrate I is layered on the ninth layer from the bottom of the multilayer substrate. Pattern electrodes defining the inductors GSL2, GL, Lt2, DSL2, Lt1, GLt1, DLt1, and DLt2 are provided on the bottom surface of the substrate I.

The substrate J is layered on the tenth layer from the bottom of the multilayer substrate. Pattern electrodes defining the inductors GSL2, GL, Lt1, GLt1, DLt1, DLt2, and DL are provided on the bottom surface of the substrate J.

The substrate K is layered on the eleventh layer from the bottom of the multilayer substrate. Pattern electrodes defining the inductors GSL2, GL, Lt2, DSL2, Lt1, GLt1, DLt1, DLt2, and DL are provided on the bottom surface of the substrate K.

The substrate L is layered on the twelfth layer from the bottom of the multilayer substrate. Pattern electrodes defining the inductors GSL2, GL, DSL2, GLt1, and DL are provided on the bottom surface of the substrate L.

The substrate M is layered on the thirteenth layer from the bottom of the multilayer substrate. Pattern electrodes defining inductors GSL2, GL, DSL2, Lt2, and DL are provided on the bottom surface of the substrate M.

The substrate N is layered on the fourteenth layer from the bottom of the multilayer substrate. A pattern electrode defining the inductor GL is provided on the bottom surface of the substrate N.

The inductors GSL2, GL, Lt2, DSL2, Lt1, GLt1, DLt1, DLt2, and DL are defined across the substrates I to N.

The substrate O is layered on the fifteenth layer from the bottom of the multilayer substrate. Pattern electrodes defining the capacitors Ct1 and DCc1 are provided on the bottom surface of the substrate O.

The substrate P is layered on the sixteenth layer from the bottom of the multilayer substrate. Pattern electrodes defining the capacitors Ct1/Cc1 and GCc1 are provided on the bottom surface of the substrate P.

The substrate Q is layered on the seventeenth layer from the bottom of the multilayer substrate. Pattern electrodes defining the capacitors Cc1/Cc2, GCc1, and DCc1/DCc2 are provided on the bottom surface of the substrate Q.

The substrate R is layered on the eighteenth layer from the bottom of the multilayer substrate. A pattern electrode defining the capacitor Cc2 is provided on the bottom surface of the substrate R.

The substrate S is layered on the nineteenth layer from the bottom of the multilayer substrate. A pattern electrode defining the capacitor DCc2 and a pattern electrode defining an inner-layer ground electrode are provided on the bottom surface of the substrate S.

The capacitors Ct1, DCc1, GCc1, Cc1, Cc2, and DCc2 are arranged across the substrates O to S.

The substrate T is layered on the twentieth layer from the bottom of the multilayer substrate and corresponds to the top layer of the high-frequency module 1. Pattern electrodes functioning as element installed electrodes are provided on the top surface of the substrate T and pattern electrodes functioning as extraction electrodes are provided on the bottom surface of the substrate T.

The layered substrate shown in the above layer views can be used to define the high-frequency module according to the preferred embodiments of the present invention. The present invention is not limited to the configuration of the layered substrate described above and may have other suitable configurations.

An example of the configuration of a high-frequency module according to a second preferred embodiment of the present invention will be described herein. The same reference numerals are used in the second preferred embodiment to identify the same components in the high-frequency module in the first preferred embodiment. A description of such components is omitted herein. The high-frequency module according to the second preferred embodiment is preferably used in a front end portion of a mobile phone and supports three communication systems for a GSM 900 MHz band, a GSM 1800 MHz band, and a GSM 1900 MHz band.

Figure 7:
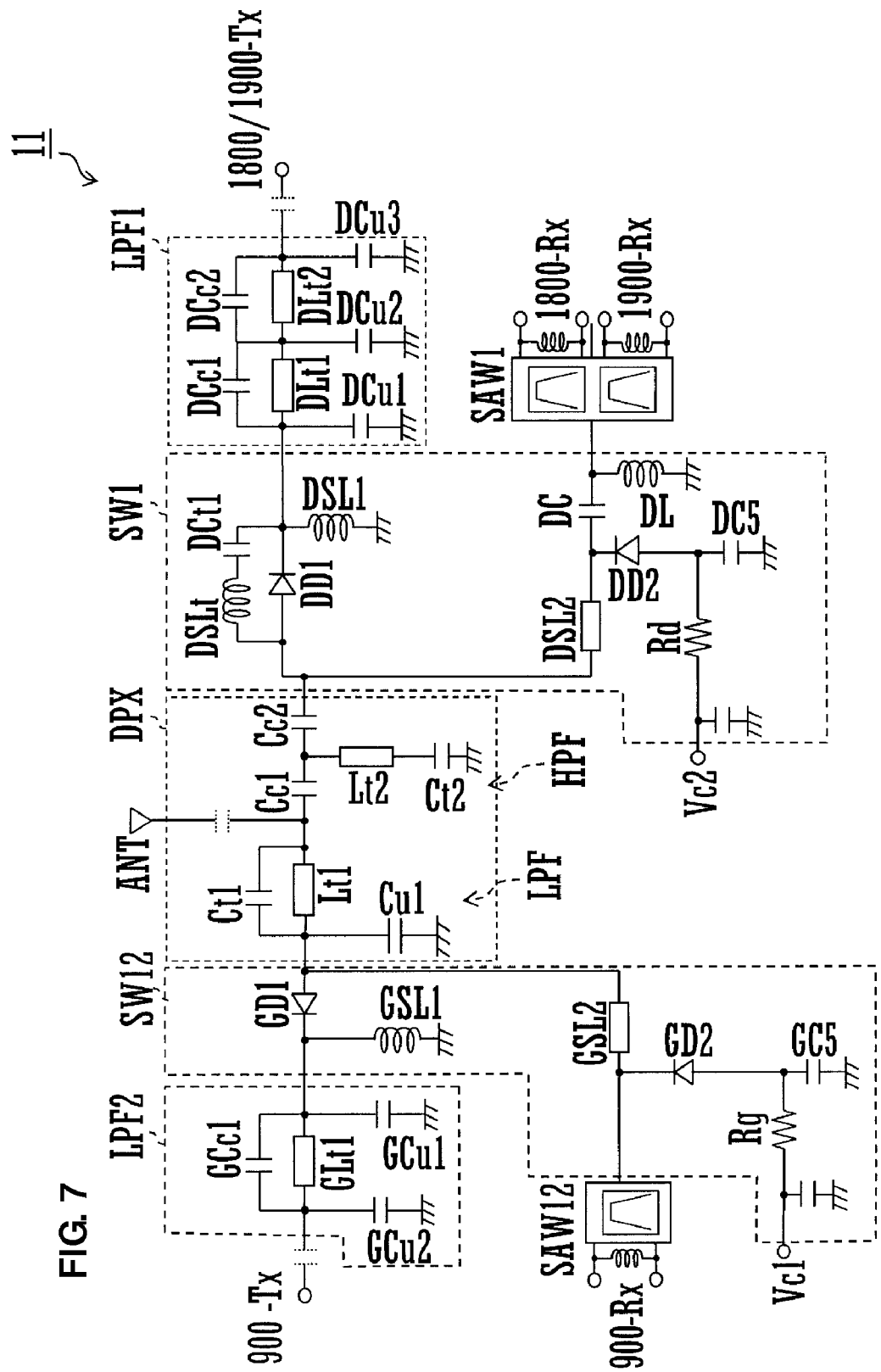
FIG. 7 is a schematic circuit diagram of a high-frequency module according to a second preferred embodiment of the present invention.

FIG. 7 is a schematic circuit diagram of a high-frequency module 11 according to the second preferred embodiment.

Referring to FIG. 7, the high-frequency module 11 includes the diplexer DPX, the switch circuit SW1, a switch circuit SW12, the low pass filters LPF1 and LPF2, the surface acoustic wave filter SAW1, and a surface acoustic wave filter SAW12. The high-frequency module 11 includes the antenna port ANT, the signal ports 1800/1900-Tx, 1800-Rx, 1900-Rx, and 900-Rx, a signal port 900-Tx, and the control ports Vc1 and Vc2 as external connection ports.

The switch circuit SW12 is connected to the low pass filter LPF, the low pass filter LPF2, and the surface acoustic wave filter SAW12 and is used to switch between GSM900 transmission signals and GSM900 reception signals. The signal path in the switch circuit SW12 between the low pass filter LPF and the surface acoustic wave filter SAW12 includes the inductor GSL2, the diode GD2, the capacitor GC5, and the resistor Rg.

A first end of the inductor GSL2 is connected to the connection point between the low pass filter LPF and the diode GD1 and a second end thereof is connected to the surface acoustic wave filter SAW12. A cathode of the diode GD2 is connected to the connection point between the inductor GSL2 and the surface acoustic wave filter SAW12. An anode of the diode GD2 is connected to the control port Vc1 via the resistor Rg and is grounded via the capacitor GC5. In the switch circuit SW12, the states of the diodes GD1 and GD2 are switched on the basis of a voltage externally supplied through the control port Vc1.

In the high-frequency module 11 having the above-described configuration, even if a signal attempts to leak from the switch circuit SW12 into the switch circuit SW1 in the transmission of the GSM900 signal, it is possible to prevent the leakage of the signal because the impedance of the connection point between the diplexer DPX and the switch circuit SW1 is short-circuited due to the series resonance between the inductor DSL2, the capacitor DC, and the inductor DL in the switch circuit SW1, thus improving the isolation.

While preferred embodiments of the invention have been described above, it is to be understood that variations and modifications will be apparent to those skilled in the art without departing from the scope and spirit of the invention. The scope of the invention, therefore, is to be determined solely by the following claims.

What is claimed is:

1. A high-frequency module comprising:
    at least first and second signal circuits;
    a common antenna port; and
    at least first and second signal ports, each of the at least first and second signal circuits being connected between the common antenna port and the at least first and second signal ports; wherein
    the first signal circuit includes:
        a first inductor connected in series between the antenna port and the first signal port;
        a first capacitor connected in series between the first inductor and the first signal port; and
        a second inductor connected in shunt between the first capacitor and the first signal port;
        a first switch element, a first end of which is connected between the first inductor and the first capacitor;
        a second capacitor connected in series between a second end of the first switch element and ground; and
        a second switch element connected in series between the antenna port and the second signal port;
    the first signal circuit is arranged to produce series resonance between the first inductor, the first capacitor, and the second inductor at a frequency within the frequency band of a target signal of the second signal circuit;
    the first inductor includes a line having an electrical length that is equal to about one fourth of the wavelength of a signal propagated between the antenna port and the second signal port; and
    the first signal circuit is arranged to produce the series resonance between the second capacitor and the inductance occurring in the first switch element during the operation of the first switch element at a frequency within the frequency band of the signal propagated between the antenna port and the second signal port.

2. The high-frequency module according to claim 1, wherein the first signal circuit further includes:
    a filter element connected in series between the first capacitor and the first signal port; and
    one end of the second inductor is connected between the first capacitor and the filter element, and the first capacitor and the second inductor define a matching circuit for the filter element.

3. The high-frequency module according to claim 1, wherein a frequency of a signal propagated through the first signal circuit is higher than a frequency of a signal propagated through the second signal circuit.

* * * * *